United States Patent
Vigilante

(10) Patent No.: US 10,957,418 B1
(45) Date of Patent: Mar. 23, 2021

(54) INTERCONNECT SYSTEM

(71) Applicant: Micron Technology, Inc., Boise, ID (US)

(72) Inventor: Andrea Vigilante, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/550,510

(22) Filed: Aug. 26, 2019

(51) Int. Cl.
| | |
|---|---|
| H01L 23/48 | (2006.01) |
| G11C 29/56 | (2006.01) |
| G06F 13/16 | (2006.01) |
| G06F 13/10 | (2006.01) |
| H01R 12/71 | (2011.01) |
| G01R 1/067 | (2006.01) |
| G01R 31/317 | (2006.01) |
| G11C 16/04 | (2006.01) |

(52) U.S. Cl.
CPC .............. *G11C 29/56* (2013.01); *G01R 1/067* (2013.01); *G01R 31/31713* (2013.01); *G06F 13/105* (2013.01); *G06F 13/1668* (2013.01); *H01R 12/714* (2013.01); *H01R 12/716* (2013.01); *G11C 16/0483* (2013.01); *G11C 2029/5602* (2013.01)

(58) Field of Classification Search
CPC .................................................. H01L 25/0657
USPC .......................................................... 257/774
See application file for complete search history.

(56) References Cited

U.S. PATENT DOCUMENTS

| | | | |
|---|---|---|---|
| 2006/0235577 A1* | 10/2006 | Ikeda | G11C 5/02 701/1 |
| 2012/0173825 A1* | 7/2012 | Ehrlich | G06F 11/362 711/145 |
| 2016/0163609 A1* | 6/2016 | Rahman | G01R 31/318513 324/762.03 |
| 2017/0024298 A1* | 1/2017 | Geist | G11C 29/56016 |
| 2020/0044871 A1* | 2/2020 | Lu | H04L 9/3278 |

* cited by examiner

*Primary Examiner* — Min Huang
(74) *Attorney, Agent, or Firm* — Schwegman Lundberg & Woessner, P.A.

(57) ABSTRACT

A variety of applications can include a system having a system platform to which a memory system can be attached for operation of the system. With the memory system removed from the system platform or before being attached to the system platform, an interposer can be connected at the location for the memory system on the system platform to facilitate testing of the system with respect to the memory system. The interposer can include a set of electrical connectors embedded on a first side of the interposer to connect to the system platform and a connector embedded on a second side of the interposer opposite the first side, where the connector allows coupling to an external platform to convey signals between the system platform and the external platform. Additional apparatus, systems, and methods are disclosed.

23 Claims, 13 Drawing Sheets

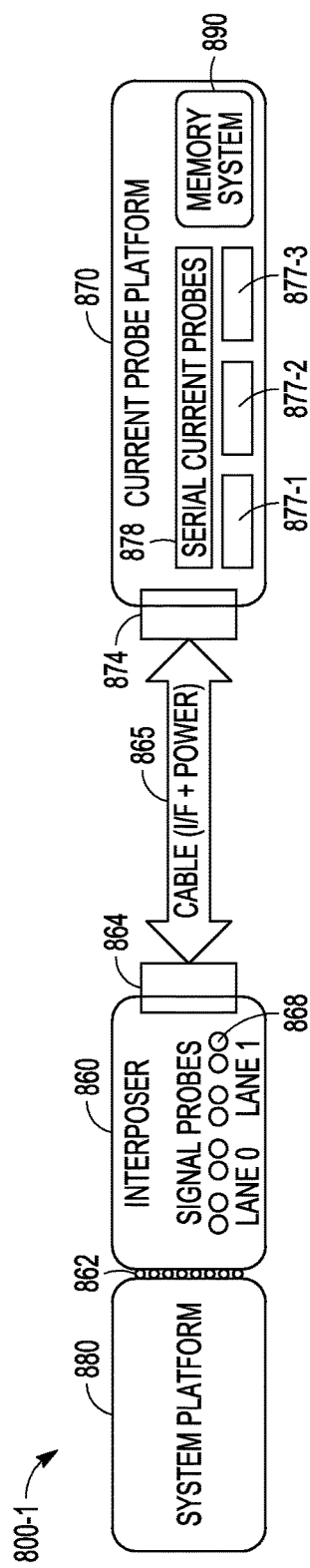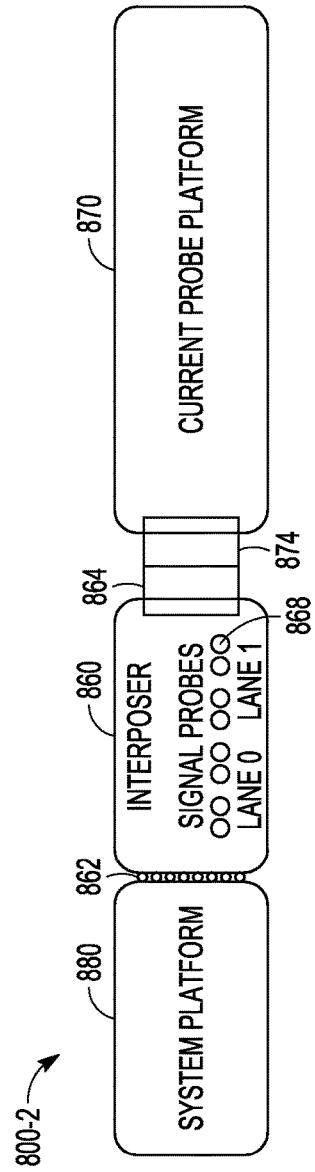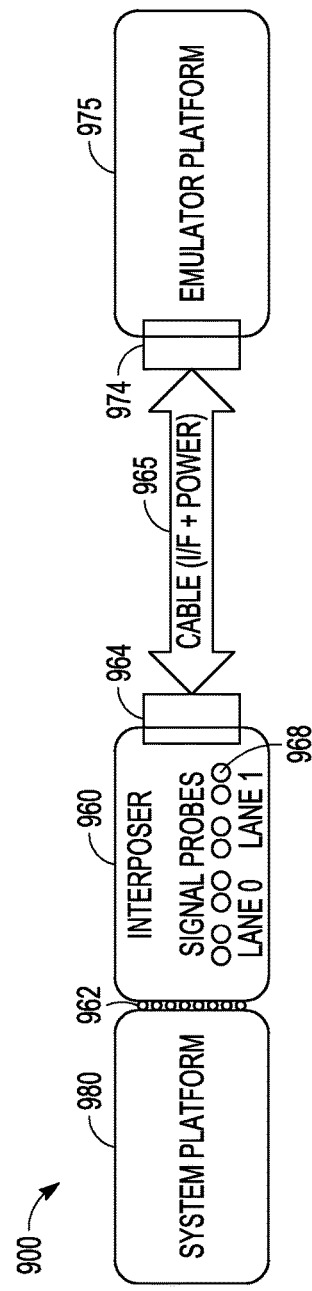
FIG. 8A
FIG. 8B
FIG. 9

INTERCONNECT SYSTEM

BACKGROUND

Memory devices are typically provided as internal, semiconductor, integrated circuits in computers or other electronic devices. There are many different types of memory, including volatile and non-volatile memory. Volatile memory requires power to maintain its data. Examples of volatile memory include random-access memory (RAM), dynamic random-access memory (DRAM), and synchronous dynamic random-access memory (SDRAM), among others. Non-volatile memory can retain stored data when not powered. Examples of non-volatile memory include flash memory, read-only memory (ROM), electrically erasable programmable ROM (EEPROM), erasable programmable ROM (EPROM), resistance variable memory, such as phase-change random-access memory (PCRAM), resistive random-access memory (RRAM), and three-dimensional (3D) XPoint™ memory, among others.

Flash memory is utilized as non-volatile memory for a wide range of electronic applications. Flash memory devices typically include one or more groups of one-transistor, floating gate, or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the memory cells in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. Unless otherwise clearly indicated by express language or context, MLC is used herein in its broader context, to refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storage cells of the string. In the example of a vertical string, the polysilicon structure may be in the form of a vertically extending pillar. In some examples, the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state memory device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells, to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs can also include DRAM or SRAM (or other forms of memory die or other memory structures). The SSD can receive commands from a host in association with memory operations, such as read or write operations, to transfer data (e.g., user data and associated integrity data, such as error data and address data, etc.) between the memory devices and the host, or erase operations to erase data from the memory devices.

In general, a managed NAND system, also referred to as managed NAND, is realized as a combination of one or more individual NAND flash memory devices combined with a hardware controller that performs management features for the flash memories. SSD, UFS, and eMMC devices can be managed NAND memory systems that include processing circuitry such as memory controllers, direct memory access (DMA) controllers, and flash memory interface circuitry to manage the access to physical memory. At various times, testing with respect to an application to which a memory system is designed can be appropriate to determine factors such as power consumption, for example, in a mobile phone. Enhancements with respect to the testing instruments and operational procedures associated with such instruments can provide improved efficiencies for testing.

BRIEF DESCRIPTION OF THE DRAWINGS

The drawings, which are not necessarily drawn to scale, illustrate generally, by way of example, but not by way of limitation, various embodiments discussed in the present document.

FIGS. 8A-8B show two configurations for systems having a current probe platform coupled to an interposer that is connected to a system platform, according to various embodiments.

FIG. 9 is a block diagram of a system having an emulator platform coupled to an interposer that is connected to a system platform, according to various embodiments.

DETAILED DESCRIPTION

The following detailed description refers to the accompanying drawings that show, by way of illustration and not limitation, various embodiments in which an invention can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In a number of different systems, testing of a system with respect to an associated memory system can relate to various testing scenarios. For example, testing with respect to a system associated with a memory system can include measuring current consumption using a serial probe, such as a shunt resistor, probing memory system signals, testing at different temperature conditions, and replacing the memory system with an emulator platform in the testing of the system with respect to the associated memory system.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

Figure 1:
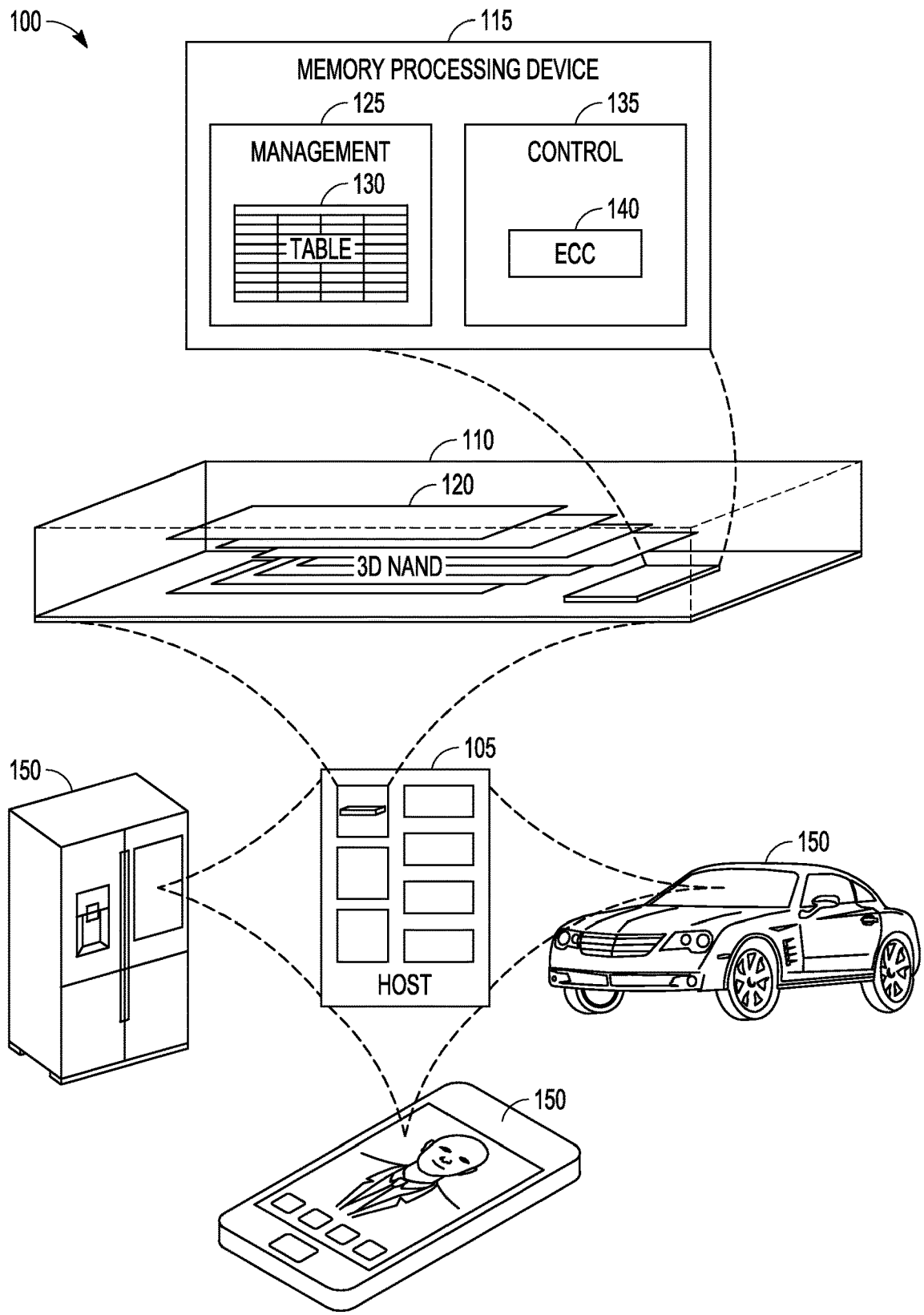
FIG. 1 illustrates an example of an environment including a memory device, according to various embodiments.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory processing device 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host device 105 may be a machine having some portion, or all, of the components discussed in reference to the machine 500 of FIG. 5.

The memory processing device 115 can receive instructions from the host device 105, and can communicate with the memory array 120, such as to transfer data to (e.g., write or erase) or from (e.g., read) one or more of the memory cells, planes, sub-blocks, blocks, or pages of the memory array 120. The memory processing device 115 can include, among other things, circuitry or firmware, including one or more components or integrated circuits. For example, the memory processing device 115 can include one or more memory control units, circuits, or components configured to control access across the memory array 120 and to provide a translation layer between the host device 105 and the memory device 110. The memory processing device 115 can include one or more input/output (I/O) circuits, lines, or interfaces to transfer data to or from the memory array 120. The memory processing device 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory processing device 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory processing device 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory processing device 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory processing device 115. The memory processing device 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
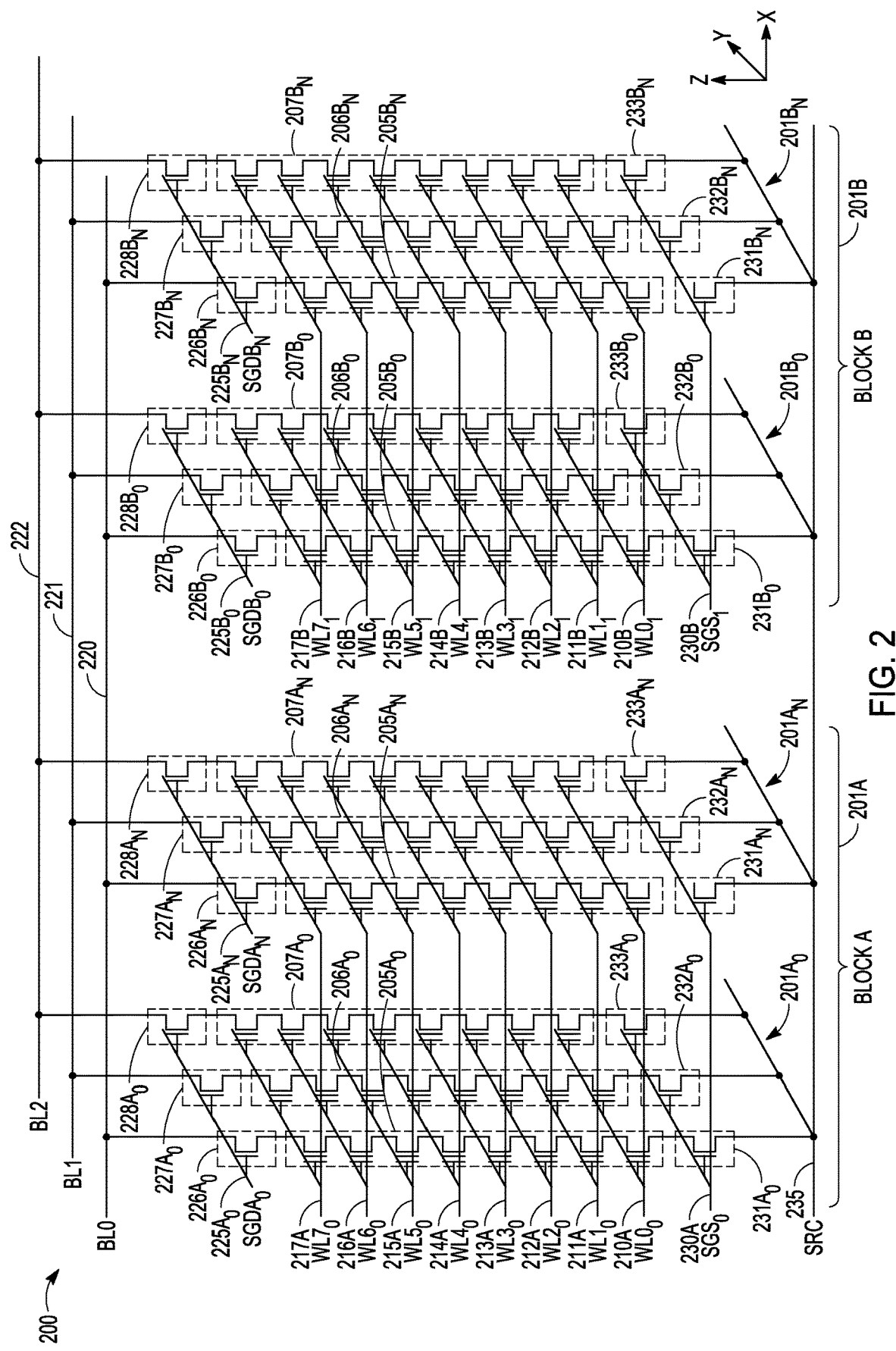
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures than would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B$-$233B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array 200 can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array 200, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array 200 can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
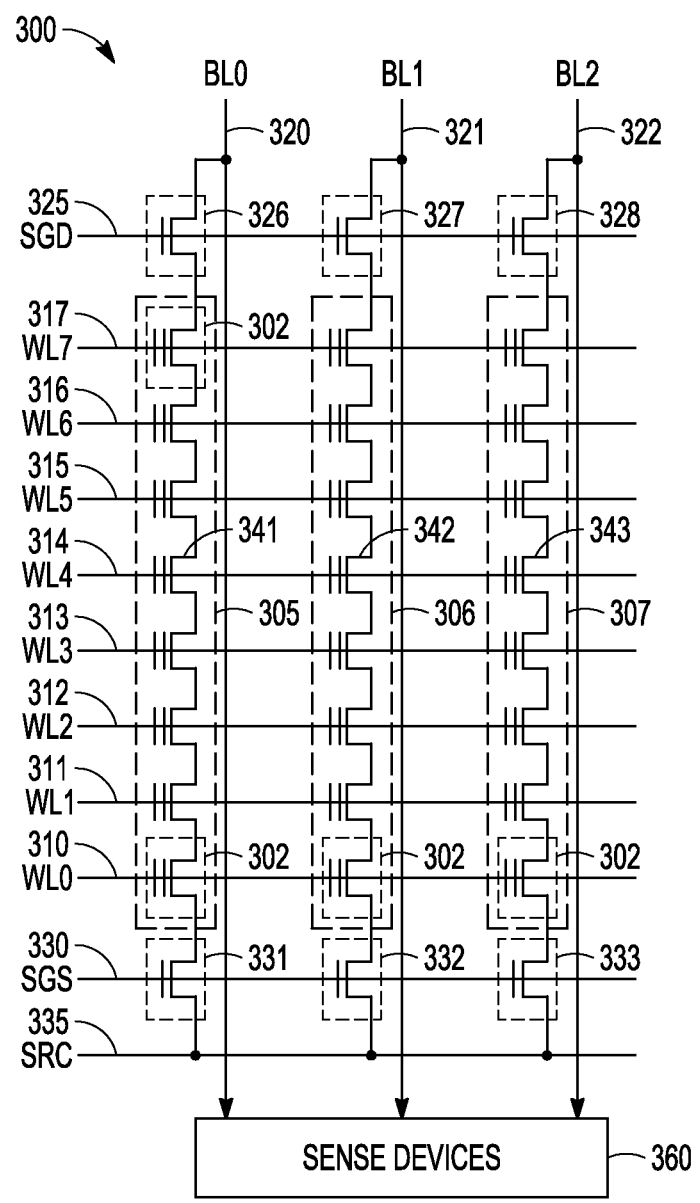

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense devices 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
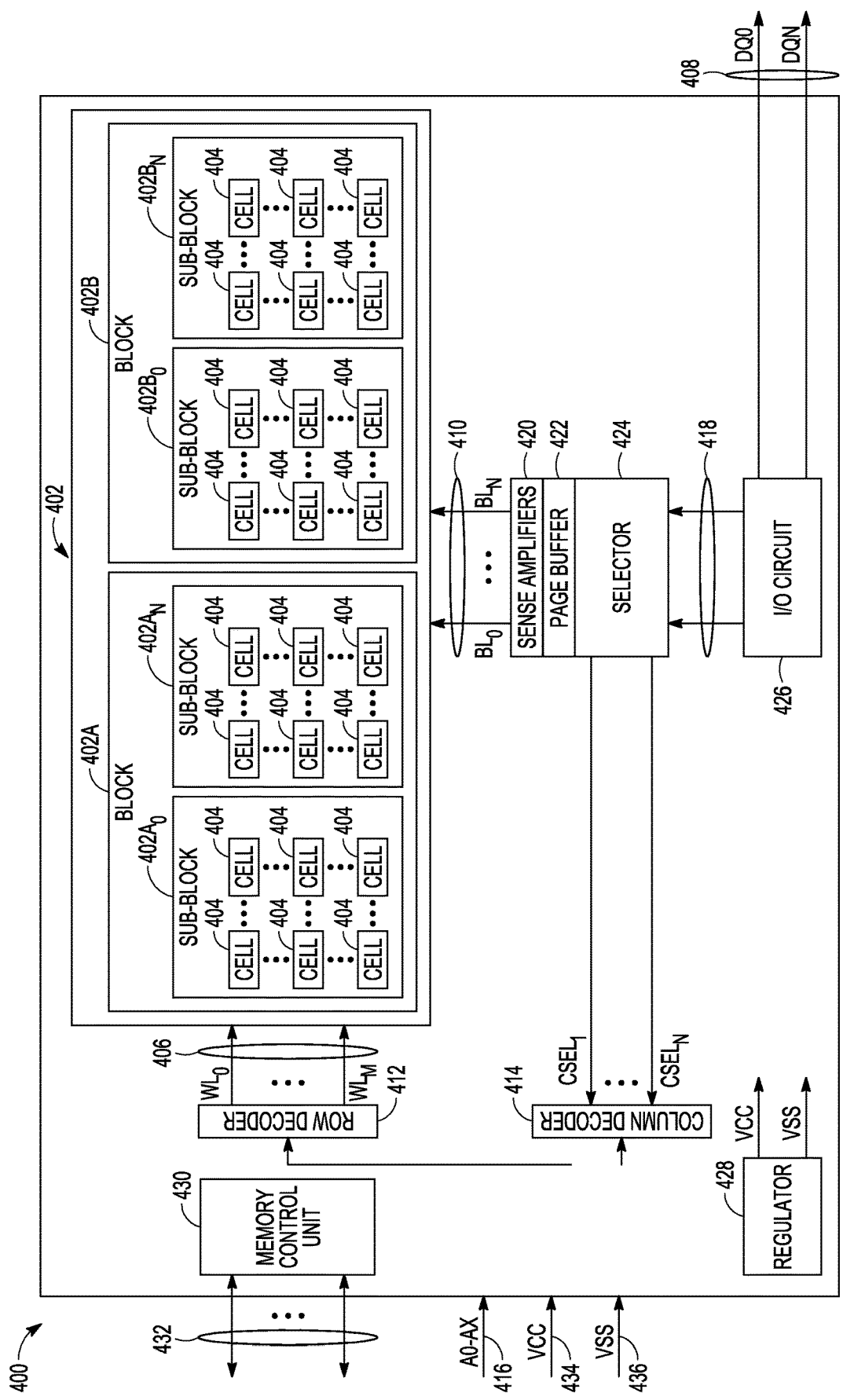
FIG. 4 illustrates an example block diagram of a memory module, according to various embodiments.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402 or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
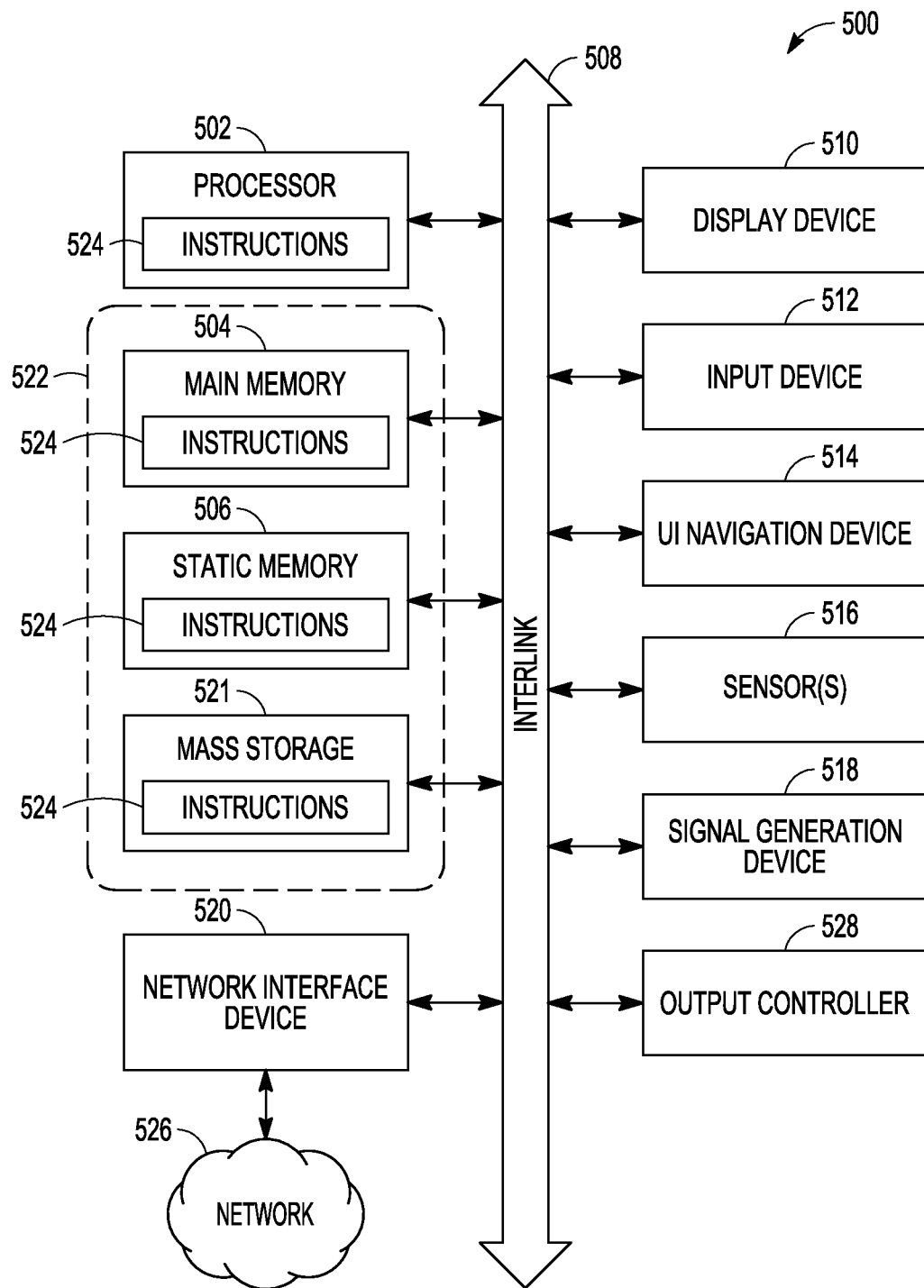
FIG. 5 is a block diagram illustrating an example of a machine upon which one or more embodiments may be implemented, according to various embodiments.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) may include a hardware processor 502 (e.g., a central processing unit (CPU), a graphics processing unit (GPU), a hardware processor core, or any combination thereof, such as the memory processing device 115, etc.), a main memory 504 and a static memory 506, some or all of which may communicate with each other via an interlink (e.g., bus) 508. The machine 500 may further include a display device 510, an alphanumeric input device 512 (e.g., a keyboard), and a user interface (UI) navigation device 514 (e.g., a mouse). In an example, the display device 510, input device 512, and UI navigation device 514 may be a touch screen display. The machine 500 may additionally include a mass storage device (e.g., drive unit) 521, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 500 may include a machine-readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 521 may constitute the machine-readable medium 522.

While the machine-readable medium 522 is illustrated as a single medium, the term "machine-readable medium" may include a single medium or multiple media (e.g., a centralized or distributed database, or associated caches and servers) configured to store the one or more instructions 524.

The term "machine-readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the storage device 521, and can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage device 521 is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging can take place in the compressed block until it is time to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission signal" shall be taken to include any signal that is capable of storing, encoding, or carrying instructions for execution by the machine 500, and includes digital or analog communications signals or other signals to facilitate communication of such software.

Figure 6A:
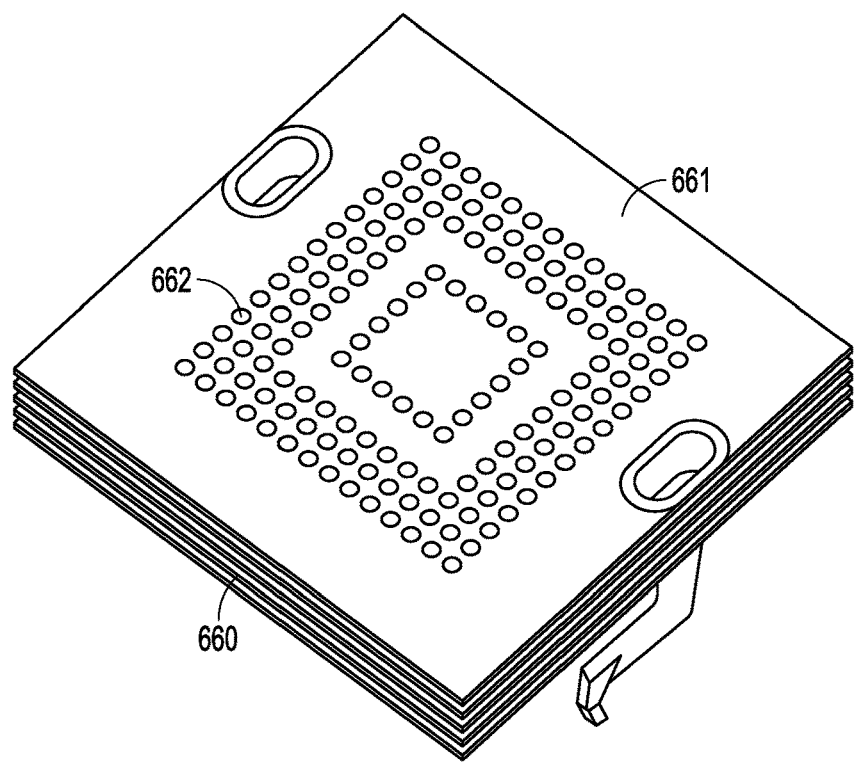
FIGS. 6A-6B illustrate an interposer that can be used to interconnect a system to testing apparatus for testing of the system with respect to a memory system that is structured to operate with the system, according to various embodiments.
Figure 6B:
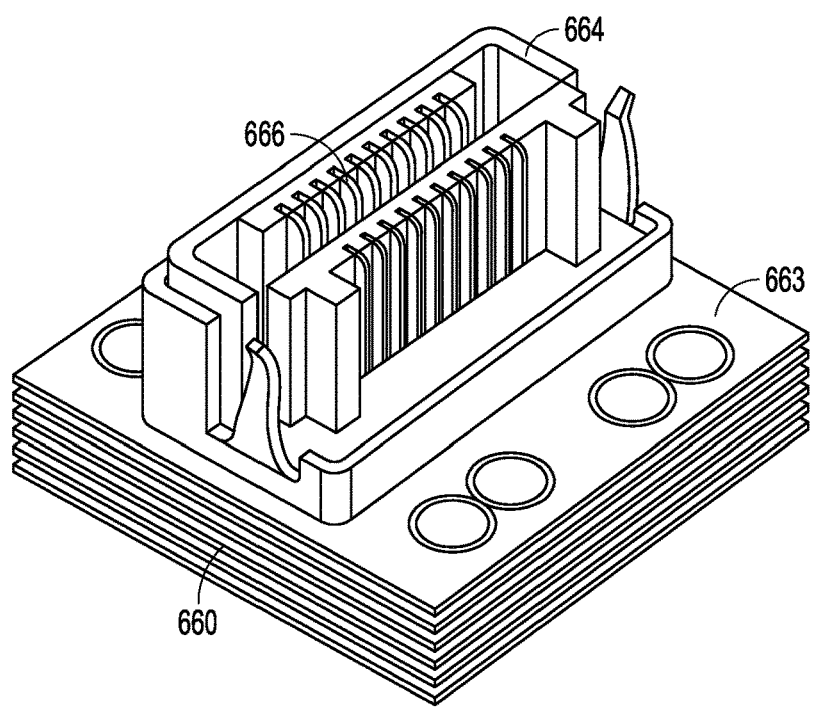

FIGS. 6A-6B illustrate an interposer 660 that can be used to interconnect a system to testing apparatus for testing of the system with respect to a memory system that is structured to operate with the system. With respect to the memory system, the system can be considered an application system that uses the memory system. For example, an application system can be, but is not limited to, a mobile phone. FIG. 6A shows the interposer 660 having a first side 661 to connect to a system platform of the system that is the subject of testing with respect to a designated memory system. A set of electrical connectors 662 can be embedded on the first side 661 of the interposer 660, with the electrical connectors 662 of the set of electrical connectors arranged in a pattern. The pattern can correspond to a layout of connections of the memory system that is to mate with the system platform to operate with the system. For example, the system can be a mobile phone having a motherboard that provides the system platform of the mobile phone. A memory system can mate to the system platform of the mobile phone to operate as a memory system for the mobile phone. The memory system can be realized in a number of formats. The memory system can be a managed NAND memory system. The memory system can be a UFS system. The memory system can be a UFS managed NAND memory system. With respect to the system, the memory system is a memory device that is arranged as one or more memory devices or as a managed memory system. The interposer 660 can be implemented with other application systems and other application system platforms to provide an interconnect system with respect to an appropriate memory system to operate with the particular application system.

To test operation of the system with respect to the memory system, the memory system can be removed from the system platform of the system and the interposer can be coupled to the system platform. The testing can also be conducted for the memory system before it is placed on the system platform to operate with the system. This coupling of the interposer to the system platform can be accomplished using the electrical connectors 662 on the surface of the first side 661 of the interposer 660. With the electrical connectors 662 arranged in a pattern corresponding to the layout of connections of the memory system that is to mate with the system platform to operate with the system, the interposer 660 is equivalent to the memory system in the frame of reference of the system platform. In this frame of reference, signals conveyed, both as inputs and outputs, between the system platform and the interposer 660 can be memory-related signals for the system having the system platform.

FIG. 6B shows a second side 663 opposite the first side 661 of the interposer 660 of FIG. 6A, where the second side 663 is structured to couple to an external platform to test the system associated with a particular memory system. A connector 664 can be embedded on the second side 663 of the interposer 660, where the connector 664 is operable to couple to the external platform to convey signals between the system platform and the external platform. Alternatively, the connector 664 can connect to a cable to access the external platform. Such signals can be related to signals associated with the particular memory system. The connector 664 embedded on the second side 663 can include electrical pins 666 extending outward from the second side 663 of the interposer 660. The interposer 660 can include a set of test points on the second side 663 opposite the first side 661 to measure memory system signals by an external equipment. Examples of external equipment include, but are not limited to, an oscilloscope, a protocol analyzer, or other similar testing equipment.

The interposer 660 can be smaller than the memory system associated with the test with respect to the system. The memory system can be a memory packaged with a ball grid array. Similarly, the electrical connectors 662 on the first side 661 can be structured as a ball grid array of electrical connectors. The external platform to which the system is being coupled with the interposer 660 by the connector 664 of the interposer 660 can include a current probe platform, a memory emulator platform, or other platform can be used in some form of testing or simulation. The connector 664 can be arranged to couple to the current probe platform, to the memory emulator platform, or to the platform directly or by a cable.

Figure 7A:
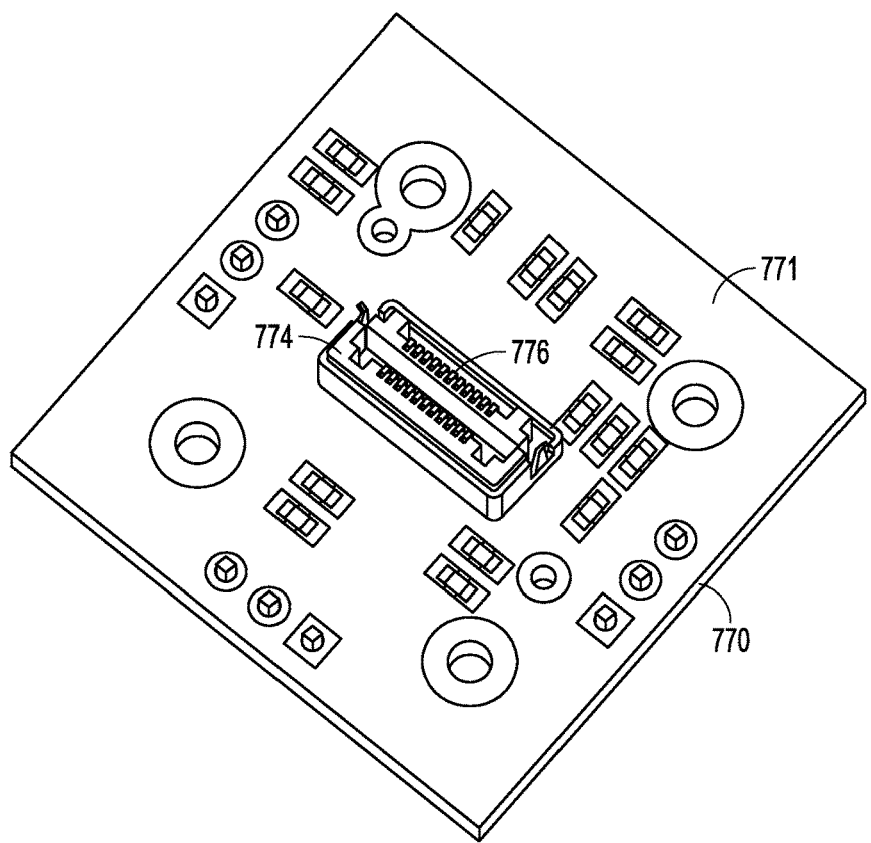
FIGS. 7A-7B illustrate a current probe that can be used with the interposer of FIGS. 6A-6B to test a system with respect to a memory system that is structured to operate with the system, according to various embodiments.
Figure 7B:
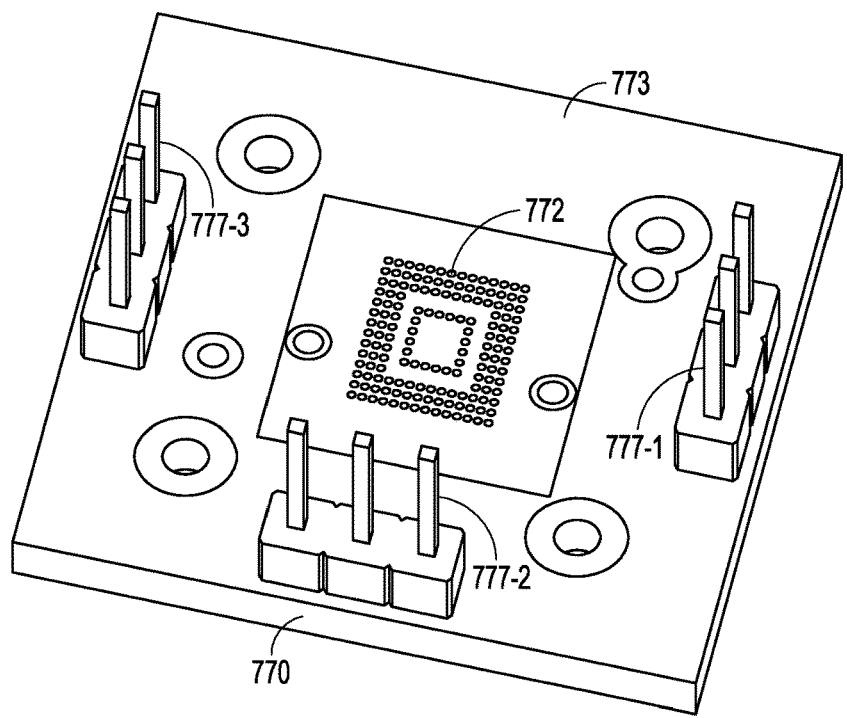

FIGS. 7A-7B illustrate a current probe 770 that can be used with the interposer 660 of FIGS. 6A-6B to test a system with respect to a memory system that is structured to operate with the system. The current probe 770 is an external platform to the system under test that includes circuitry to perform a variety of test functions on the system with respect to the particular memory system designed for operation in the system. FIG. 7A shows the current probe 770 having a first side 771 to couple to an interconnect to a system platform of the system that is the subject of testing with respect to a particular memory system. The interconnect can be the interposer 660 of FIGS. 6A-6B. The current probe 770 can include a connector 774 on the first side 771 of current probe 770, where the connector 774 can couple to the connector 664 on the second side of interposer 660. The connector 774 can include electrical receptacles 776 to couple to the electrical pins 666 of the connector 664 on the second side 663 of the interposer 660. Such coupling can be a direct, removable connection of the electrical pins 666 of the connector 664 into the electrical receptacles 776 of connector 774. Alternatively, the coupling can be via a cable, where the cable has a connector at one end of the cable that can mate with the electrical pins 666 of the connector 664 on the second side 663 of the interposer 660, and another connector at another end of the cable that can mate to the electrical receptacles 776 of connector 774 on the first side 771 of current probe 770.

FIG. 7B shows a second side 773 opposite the first side 771 of the current probe 770 of FIG. 7A, where the second side 773 is structured to provide instrumentalities for testing. For example, the current probe 770 can include electrical connections 772 to a memory system attached to the second side 773, where the electrical connections 772 include a set of electrical connections patterned to mate with the input and output connections to the memory system. With this mating, signals can be input to and output from the attached memory system as memory-related signals. These memory-related signals can be generated as signals used in a particular type of memory system that is the subject of the testing. For example, the memory-related signals can include, but are not limited to, UFS signals.

The current probe 770 can also include a number of connectors to provide test signals or power levels for the memory under test. FIG. 7B shows connectors 777-1, 777-2, and 777-3, though more or less than three connectors can be structured on the second side 773 of the current probe. Connectors 777-1, 777-2, and 777-3 can provide, for example, power references. The power references for the particular memory system being a UFS memory system can include, but are not limited to, supply voltage for memories (VCC), output stage logic power voltage (VCCQ), and a second output stage logic power voltage VCCQ2. Other external platforms can be implemented similar to the current probe 770 with respect to connections to an interposer, such as the interposer 660 of FIGS. 6A-6B, with circuitry to perform functional testing of a particular memory system that operates with a system to which the interposer 660 is attached.

FIGS. 8A-8B show two configurations for systems having a current probe platform 870 coupled to an interposer 860 that is connected to a system platform 880. FIG. 8A shows a system 800-1 with the current probe platform 870 coupled to the interposer 860 via a cable 865, where the cable 865 provides a memory system interface (I/F) and power between the current probe platform 870 and the interposer 860. The cable 865 can be, but is not limited to, a cable that can be developed as a relatively high speed cable. The cable 865 can attach to an electrical connector 864 of the interposer 860 at one end of the cable 865 and, at another end of the cable 865, the cable 865 can attach to an electrical connector 874 of the current probe platform 870.

The system platform 880 can be a platform of an application system on which a memory system 890 is disposed for operation as a system memory for the application system. The memory system 890 can be removed from the system platform 880 and placed on the current probe platform 870 for testing. Alternatively, the memory system 890 can be placed on the current probe platform 870 for testing prior to being placed on the system platform 880 for operation in the system using the system platform 880.

The system platform 880 can be a mother board for an application system. For example, the system platform 880 can be a mother board for, but is not limited to, a mobile phone. The system platform 880 can be connected to the interposer 860 with electrical connections 862 that are part of one side of the interposer 860. The electrical connections 862 can be realized as a ball grid array of electrical connectors. The number of electrical connections 862 depends on the memory system 890 designed for the system having system platform 880. For example, for electrical connections 862 realized as a ball grid array of electrical connectors, the ball grid array can be, but is not limited to, a 153-ball ball grid array. Other size ball grid arrays can be used depending on the system platform to which the ball grid array is to mate. The interposer 860 can be disposed on the system platform 880 vertically from a surface of the system platform 880.

The interposer 860 can include a number of channels of signal probes 868 that convey signals or power between the system platform 880 and the current probe platform 870. The channels can be arranged as lanes of transmission. FIG. 8A shows an example of lane 0 and lane 1, but the interposer 860 may include more or less than two lanes for signal probes. The interposer 860 can be structured with an electrical connection 864 that can couple to the cable 865. The interposer 860 with the electrical connections 862 and the electrical connection 864 can be structured as or similar to interposer 660 with the electrical connectors 662 and the connector 664 of FIGS. 6A-6B.

The current probe platform 870 can be coupled to the interposer 860 by cable 865 using the electrical connection 874, which can be structured as or similar to connector 774 of FIGS. 7A-7B. The current probe platform 870 can include circuitry to operate with serial current probes 878 to perform testing with respect to the system platform 880. The current probe platform 870 includes a region or an inner platform for coupling to the memory system 890, where the region or the inner platform includes electrical contacts to mate with input and output ports of the memory system 890. This mating allows for testing that provides a frame of reference equivalent to the memory system 890 being disposed on the system platform 880 for operation in a system application. The block diagrams of FIGS. 8A-8B are not to scale, as the memory system 890 can be larger than the interposer 860. Other diagrams herein may not be to scale. The current probe platform 870 can include a number of connections 877-1, 877-2, and 877-3 to receive reference signals or reference power for operation of the memory system 890. For example, the number of connections 877-1, 877-2, and 877-3 can be arranged to receive VCC, VCCQ, and VCCQ2.

FIG. 8B shows system 800-2 with the system platform 880-interposer 860 arrangement of FIG. 8A coupled directly to the current probe platform 870 of FIG. 8A. As in FIG. 8A, the system platform 880 is mated to the interposer 860 via electrical connections 862 with the interposer 860 having signal probes 868 and electrical connection 864 to couple with current probe platform 870. In this configuration, the electrical connection 864 can be structured to couple directly with the electrical connection 874 of the current probe platform 870, where the current probe platform 870 can be structured as in or similar to the current probe platform 870 of FIG. 8A.

In other applications, the current probe platform can be replaced by other platforms that include electrical connections that can mate with an interposer either directly or by a cable. In addition, the memory system, such as memory system 890, can be selected from a number of different formats. The memory system 890 involved in the testing using configurations of the systems 800-1 and 800-2 can be one of a number of types of memory systems. The structure of the components can be designed to be compatible with the memory system 890 of interest. For a non-limiting example, the memory system 890 can be a UFS memory system. The systems 800-1 and 800-2 can comprise the interposer 860 being a UFS interposer structured to attach to the system platform 880 with a UFS platform coupled to the UFS interposer. A set of electrical connectors can be embedded on a first side of the UFS interposer to connect to the system platform, with electrical connectors of the set of electrical connectors arranged in a pattern, where the pattern corresponds to a layout of connections of a UFS memory system to mate with the system platform. A connector can be embedded on a second side of the UFS interposer opposite the first side, with the connector operable to couple to the UFS platform to convey signals between the system platform and the UFS platform. The signals can be related to signals associated with the UFS memory system.

The UFS platform can be a UFS current probe having a region to attach the UFS memory system. The connector embedded on a second side of the UFS interposer can be arranged to couple to the UFS current probe platform directly or by a cable. The UFS current probe platform can include serial current probes for testing with respect to the UFS memory system. The UFS current probe can be operable with a temperature controller to subject the UFS memory system to testing over a range of temperatures. For example, the range of temperatures can be a range equal to or within about −40° C. to about 125° C.

The UFS platform can be a UFS emulator platform. The connector embedded on a second side of the UFS interposer can be arranged to couple to the UFS emulator platform directly or by a cable. In various embodiments, the UFS emulator platform is significantly larger than the UFS interposer such that a convenient approach to providing interconnection can be to use a cable rather than direct attachment. The UFS current probe platform can include a processing device and a storage device.

FIG. 9 is a block diagram of a system 900 having an emulator platform 975 coupled to an interposer 960 that is connected to a system platform 980. The emulator platform 975 of system 900 can be coupled to the interposer 960 via a cable 965, where the cable 965 provides a memory system interface (I/F) and power between the emulator platform 975 and the interposer 960. The cable 965 can be, but is not limited to, a cable that can be developed as a relatively high speed cable. The cable 965 can attach to an electrical connector 964 of the interposer 960 at one end of the cable 965 and, at another end of the cable 965, the cable 965 can attach to a connector 974 of the emulator platform 975.

The system platform 980 can be a platform of an application system on which a memory system can be disposed for operation as a system memory for the application system. The memory system can be removed from the system platform 980 before testing using the emulator platform 975. Alternatively, the memory system can be placed on the system platform 980 initially after testing using the emulator platform 975.

The system platform 980 can be a mother board for an application system. For example, the system platform 980 can be a mother board for, but is not limited to, a mobile phone. The system platform 980 can be connected to the interposer 960 with electrical connections 962 that are part of one side of the interposer 960. The electrical connections 962 can be realized as a ball grid array of electrical connectors. The number of electrical connections 962 depends on the memory system designed for the system having system platform 980. For example, for electrical connections 962 realized as a ball grid array of electrical connectors, the ball grid array can be, but is not limited to, a 153-ball ball grid array. Other size ball grid arrays can be used depending on the system platform to which the ball grid array is to mate. The interposer 960 can be disposed on the system platform 980 vertically from a surface of the system platform 980.

The interposer 960 can include a number of channels of signal probes 968 that convey signals or power between the system platform 980 and the emulator platform 975. The channels can be arranged as lanes of transmission. FIG. 9 shows an example of lane 0 and lane 1, but the interposer 960 may include more or less than two lanes for signal probes. The interposer 960 can be structured with an electrical connection 964 that can couple to the cable 965. The interposer 960 with the electrical connections 962 and the electrical connection 964 can be structured as or similar to interposer 660 with the electrical connectors 662 and the connector 664 of FIGS. 6A-6B.

The emulator platform 975 can be coupled to the interposer 960 by cable 965 using the connector 974 of the emulator platform 975, where connector 974 can be structured as or similar to connector 774 of FIGS. 7A-7B. The emulator platform 975 can include circuitry to operate as an emulator for a memory system for which the system platform 980 is designed to operate, where the emulator platform 975 can include one or more processing devices and data storage. Alternatively, similar to the current probe platform 870 of FIG. 8B, the emulator platform 975 can couple directly to the interposer 960 with the mating of connector 974 of the emulator platform 975 with the electrical connection 964 of the interposer 960. However, the emulator platform 975 may be substantially larger that the interposer 960 such that coupling of the emulator platform to interposer 960 is accomplished by a cable, such as the cable 965.

Figure 10B:
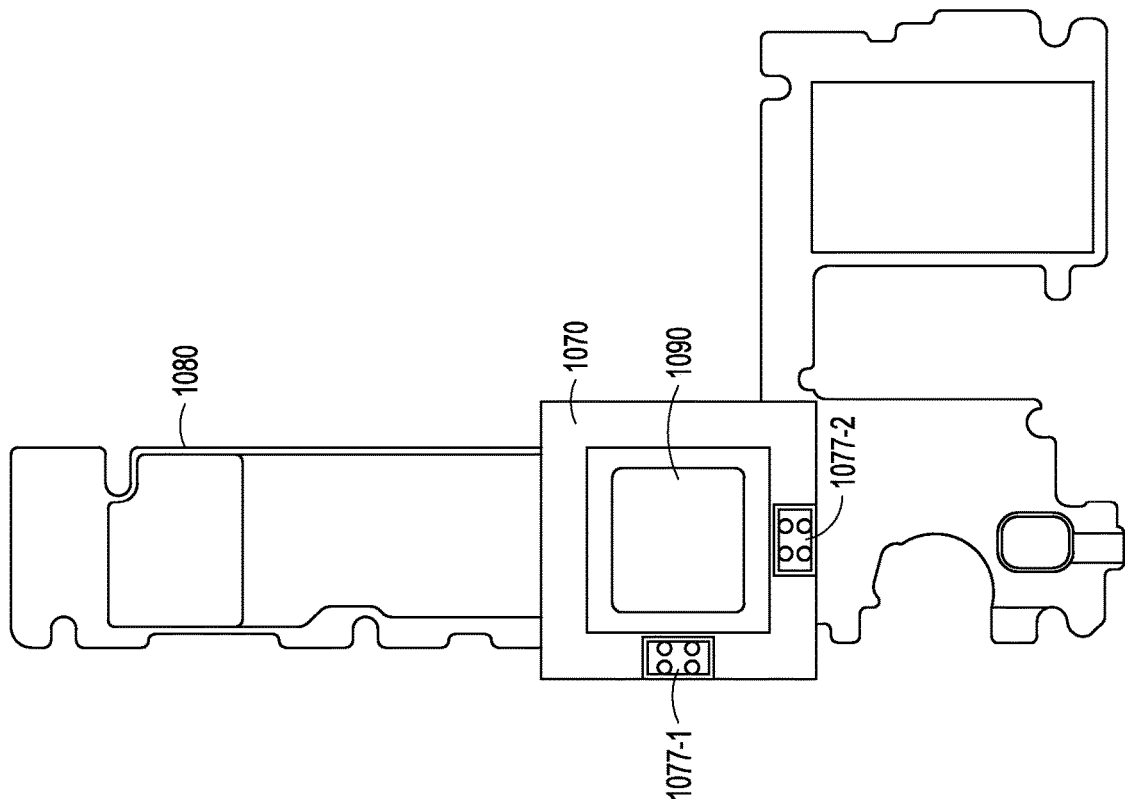
FIG. 10B shows the system platform of FIG. 10A with an external platform coupled to the interposer of FIG. 10A, according to various embodiments.
Figure 10A:
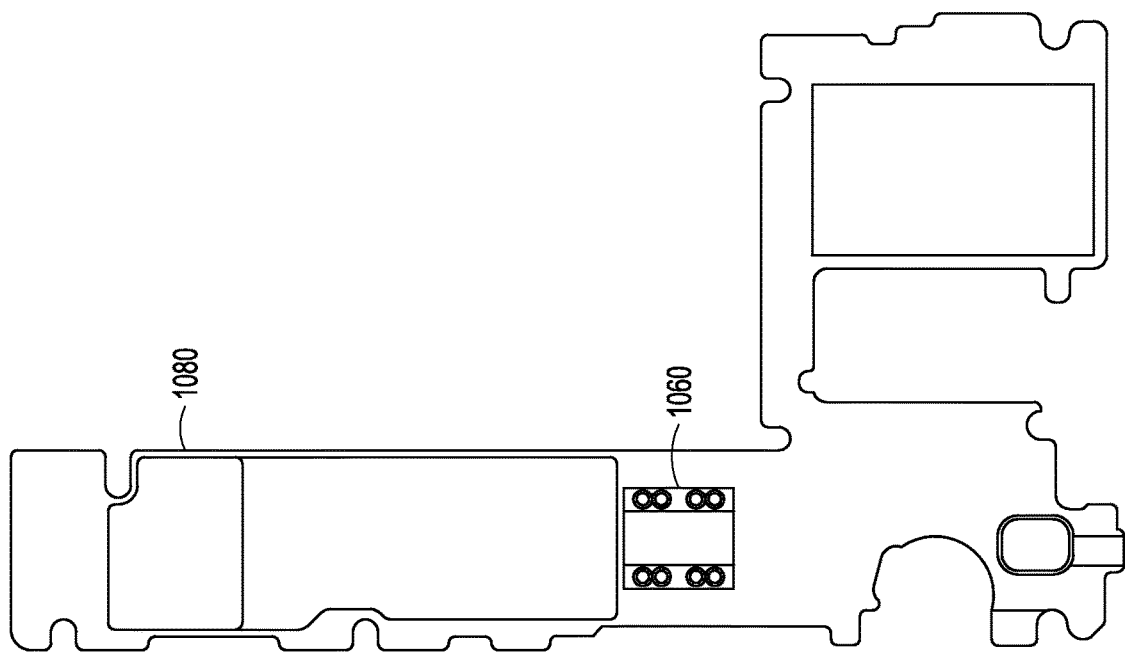
FIG. 10A shows a system platform having an interposer attached to the system platform, according to various embodiments.

FIG. 10A shows a system platform 1080 having an interposer 1060 attached to the system platform 1080. The system platform 1080 can be similar to the system platform 880 of FIGS. 8A-8B or the system platform 980 of FIG. 9. The system platform 1080 can be a motherboard. The motherboard can be a motherboard of a mobile phone. The interposer 1060 can be, but is not limited to, a structure similar to that of interposer 660 of FIGS. 6A-6B. The interposer 1060 can be attached to the system platform 1080 at a location designed for a memory system to operate with the system platform 1080 with the memory system removed or before the memory system is attached to the system platform 1080. The system platform 1080 can be tested with respect to such a memory system designed for operation with respect to the system platform 1080.

FIG. 10B shows the system platform 1080 of FIG. 10A with an external platform 1070 coupled to the interposer 1060 of FIG. 10A. With the external platform 1070 coupled to the interposer 1060, the interposer 1060 is between the system platform 1080 and the external platform 1070 and is not shown in FIG. 10B. The external platform 1070 can be attached to the interposer 1060 using a connector of the interposer 1060 and a connector of the external platform 1070 in a manner similar to the mating of the interposer 860 and the current probe platform 870 of FIG. 8B. The external platform 1070 can include a memory system 1090 disposed on the external platform 1070 and connectors 1077-1 and 1077-2 disposed on the surface of the external platform 1070 opposite the surface to which the external platform 1070 couples to the interposer 1060, where the connectors 1077-1 and 1077-2 can be arranged to receive external signals or power. The external signals can be reference signals or power levels. The external platform 1070 can include more or less than two connectors to receive external signals or power. The memory system 1090 can be disposed on the external platform 1070 for testing with respect to the system that includes the system platform 1080. The external platform 1070 can be, but is not limited to, a current probe platform. The memory system 1090 can be, but is not limited to, a UFS memory system.

Figure 11:
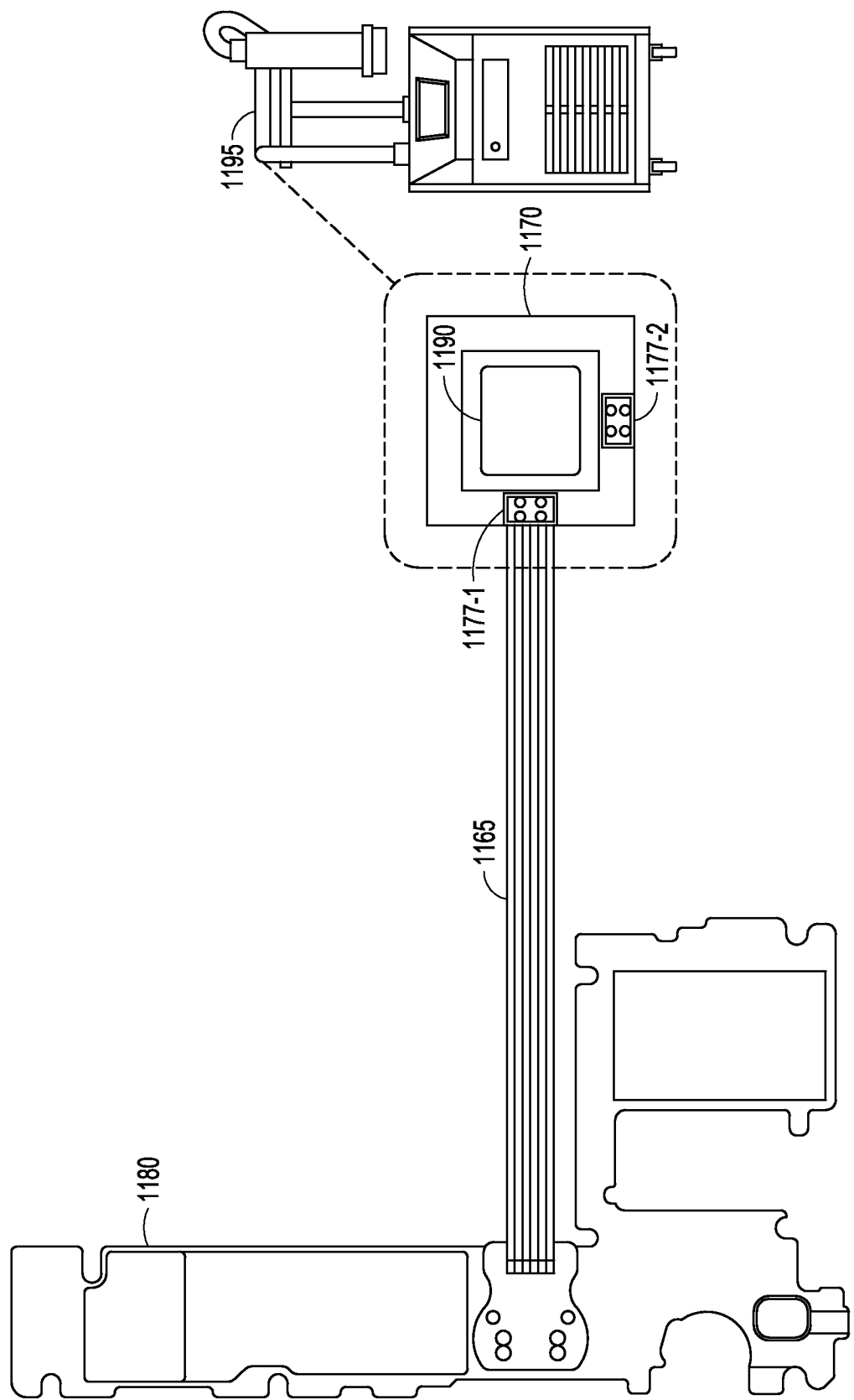
FIG. 11 shows a system platform having a cable coupled to the system platform, according to various embodiments.

FIG. 11 shows a system platform 1180 having a cable 1165 coupled to the system platform 1180. The cable 1165 can be coupled to the system platform 1180 by an interposer attached to the system platform 1180 with the cable 1165 attached to the interposer. In such a configuration, the interposer is between the system platform 1180 and the cable 1165 and is not shown in FIG. 11. The system platform 1180 can be similar to the system platform 880 of FIGS. 8A-8B or the system platform 980 of FIG. 9. The system platform 1180 can be a motherboard. The motherboard can be a motherboard of a mobile phone. The interposer between the system platform 1180 and the cable 1165 can be, but is not limited to, a structure similar to that of interposer 660 of FIGS. 6A-6B. The interposer between the system platform 1180 and the cable 1165 can be attached to the system platform 1180 at a location designed for a memory system to operate with the system platform 1180 with the memory system removed or before the memory system is attached to the system platform 1180. The system platform 1180 can be tested with respect to such a memory system designed for operation with respect to the system platform 1180.

The system platform 1180 is coupled to an external platform 1170 by the cable 1165. The external platform 1170 can include a memory system 1190 disposed on the external platform 1170 and connectors 1177-1 and 1177-2 disposed on the surface of the external platform 1170 opposite the surface to which the cable 1165 couples to the external platform 1170, where the connectors 1177-1 and 1177-2 can be arranged to receive external signals or power. The external signals can be reference signals or power levels. The external platform 1170 can include more or less than two connectors to receive external signals or power. The memory system 1190 can be disposed on the external platform 1170 for testing with respect to the system that includes the system platform 1180.

The testing can include operating at different temperatures or temperature ranges. The range of temperatures can be a range equal to or within about −40° C. to about 125° C. Testing can be implemented at other temperatures. The temperature testing can be implemented with the external platform 1170 disposed in or coupled to a temperature controller 1195. The external platform 1170 can be, but is not limited to, a current probe platform. The memory system 1190 can be, but is not limited to, a UFS memory system.

Figure 12:
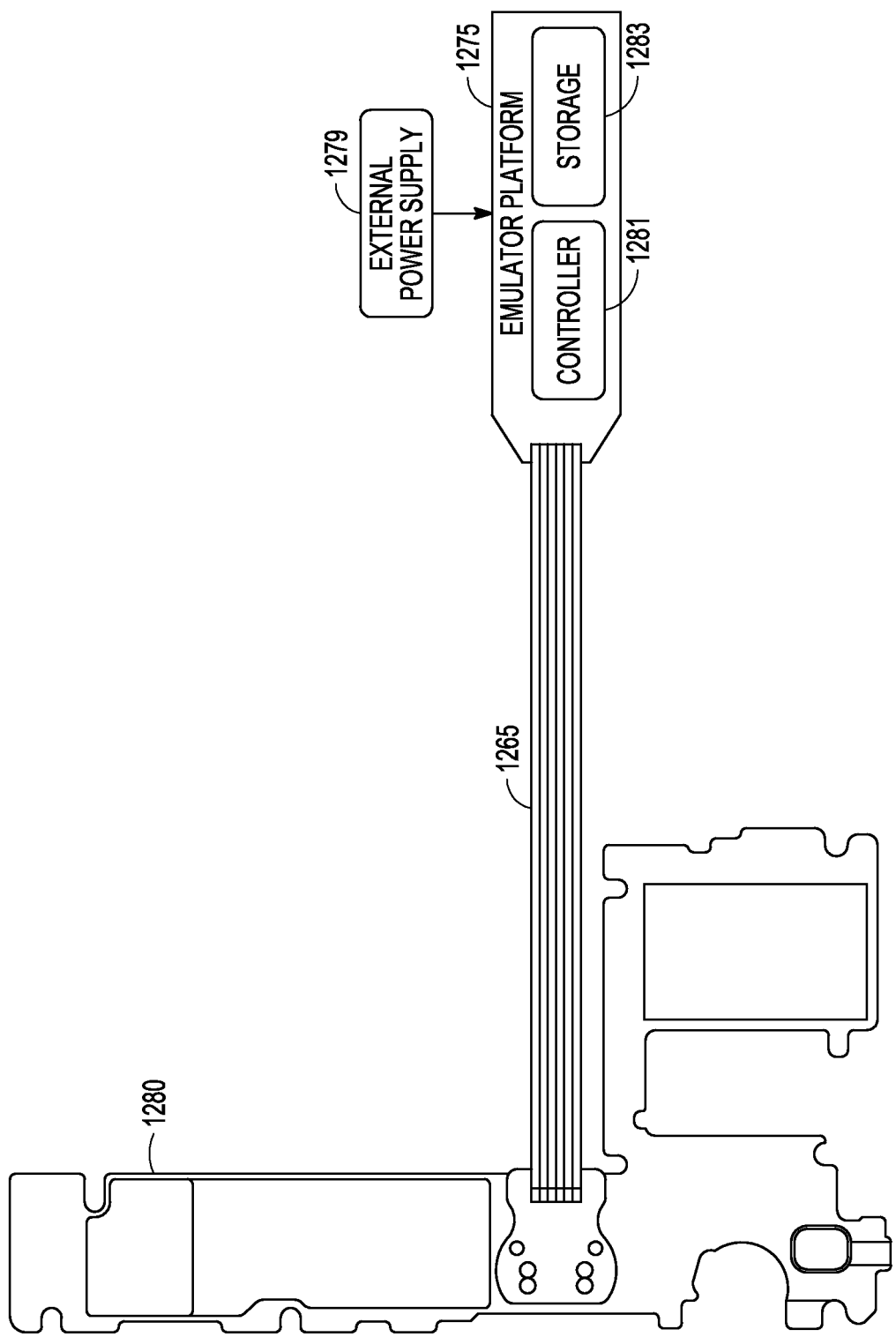
FIG. 12 shows a system platform having a cable coupled to the system platform, according to various embodiments.

FIG. 12 shows a system platform 1280 having a cable 1265 coupled to the system platform 1280. The cable 1265 can be coupled to the system platform 1280 by an interposer attached to the system platform 1280 with the cable 1265 attached to the interposer. In such a configuration, the interposer is between the system platform 1280 and the cable 1265 and is not shown in FIG. 12. The system platform 1280 can be similar to the system platform 880 of FIGS. 8A-8B or the system platform 980 of FIG. 9. The system platform 1280 can be a motherboard. The motherboard can be a motherboard of a mobile phone. The interposer between the system platform 1280 and the cable 1265 can be, but is not limited to, a structure similar to that of interposer 660 of FIGS. 6A-6B. The interposer between the system platform 1280 and the cable 1265 can be attached to the system platform 1280 at a location designed for a memory system to operate with the system platform 1280 with the memory system removed or before the memory system is attached to the system platform 1280. The system platform 1280 can be tested with respect to such a memory system designed for operation with respect to the system platform 1280.

The system platform 1280 is coupled to an emulator platform 1275 by the cable 1265. The emulator platform 1275 can include a controller 1281 and storage 1283 to perform emulation of a memory system designed to be integrated with the system having the system platform 1280. The controller 1281 can be realized as one or more processing devices. The storage 1283 can be realized as one or more data storage devices to store data resulting from emulations or instructions to perform the emulations. An external power supply 1279 can be coupled to the emulator platform 1275. The cable 1265 can be coupled to emulator platform 1275 on a surface of the emulator platform 1275 opposite the surface to which the controller 1281 is disposed on the emulator platform 1275. The emulation testing can include simulating operation at different temperatures or temperature ranges. The range of temperatures can be a range equal to or within about −40° C. to about 125° C. Emulation testing can be simulated at other temperatures. The emulator platform 1275 can be, but is not limited to, an emulator for a UFS memory system to be integrated in the system having the system platform 1280.

Figure 13:
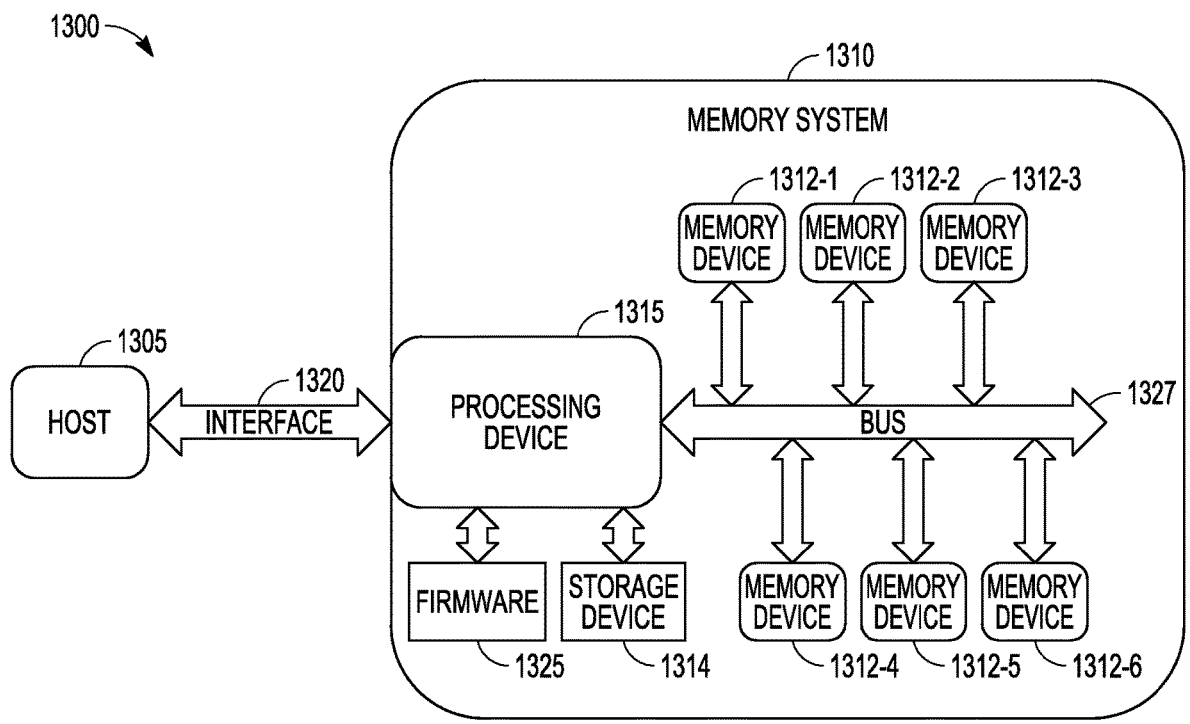
FIG. 13 is a block diagram of an embodiment of an example system including a host that operates with a memory system, according to various embodiments.

FIG. 13 is a block diagram of an embodiment of an example system 1300 including a host 1305 that operates with a memory system 1310. The host 1305 is coupled to the memory system 1310 by an interface 1320 on a system platform for the host 1305. The host 1305 can be the main processing unit for a system, such as but not limited to a mobile phone. The memory system 1310 can be packaged to attach to the system platform for the host 1305. The memory system 1310 can be a memory system similar to memory system 890 of FIGS. 8A-8B, memory system 1090 of FIG. 10, memory system 1190 of FIG. 11, or other memory system that can be implemented on a system platform as taught herein.

The memory system 1310 can include a processing device 1315 coupled to memory devices 1312-1, 1312-2, 1312-3, 1312-4, 1312-5, and 1312-6 by a bus 1327. The memory devices 1312-1, 1312-2, 1312-3, 1312-4, 1312-5, and 1312-6 can be NAND memory devices. The memory devices 1312-1, 1312-2, 1312-3, 1312-4, 1312-5, and 1312-6 can be UFS memory devices. Though six memory devices are shown in FIG. 13, the memory system 1310 can be implemented with less or more than six memory devices, that is, memory system 1310 can comprise one or more memory devices. The memory devices can be realized in a number of formats including but not limited to a plurality of memory dies. The processing device 1315 can include or be structured as one or more processors.

The memory system 1310 can comprise firmware 1325 having code executable by the processing device 1315 to at least manage the memory devices 1312-1, 1312-2, 1312-3, 1312-4, 1312-5, and 1312-6. The firmware 1325 can reside in a storage device of the memory system 1310 coupled to the processing device 1315. The firmware 1325 can be coupled to the processing device 1315 using the bus 1327 or some other interface on the memory system 1310. Alternatively, the firmware 1325 can reside in the processing device 1315 or can be distributed in the memory system 1310 with firmware components, such as but not limited to code, including one or more components in the processing device 1315. The firmware 1325 can include code having instructions, executable by the processing device 1315, to operate on the memory devices 1312-1, 1312-2, 1312-3, 1312-4, 1312-5, and 1312-6.

The system 1300 and its components can be structured in a number of different arrangements. For example, the system 1300 can be arranged with a variation of the type of components that comprise the host 1305, the interface 1320, the memory system 1310, the memory devices 1312-1, 1312-2, 1312-3, 1312-4, 1312-5, and 1312-6, the processing device 1315, and the bus 1327. The host 1305 can comprise one or more processors, which can vary in type. The interface 1320 can be arranged as, but not limited to, a peripheral component interconnect express (PCIe) interface. The processing device 1315 can include or be structured as one or more types of processors compatible with the memory devices 1312-1, 1312-2, 1312-3, 1312-4, 1312-5, and 1312-6. The bus 1327 can be an open NAND flash interface (ONFI) bus for the memory devices 1312-1, 1312-2, 1312-3, 1312-4, 1312-5, and 1312-6 being NAND flash memory devices. A storage device 1314 can be implemented to provide data or parameters used in maintenance of the memory system 1310.

The memory system 1310 can be attached to a platform external to the system 1300 to test the system 1300 with respect to the memory system 1310. The memory system 1310 can be tested in a manner similar to the memory system 890 of FIGS. 8A-8B, memory system 1090 of FIG. 10B, or memory system 1190 of FIG. 11. The memory system 1310 can be tested via an emulation platform similar to the emulator platform 975 of FIG. 9 or the emulator platform 1275 of FIG. 12.

Figure 14:
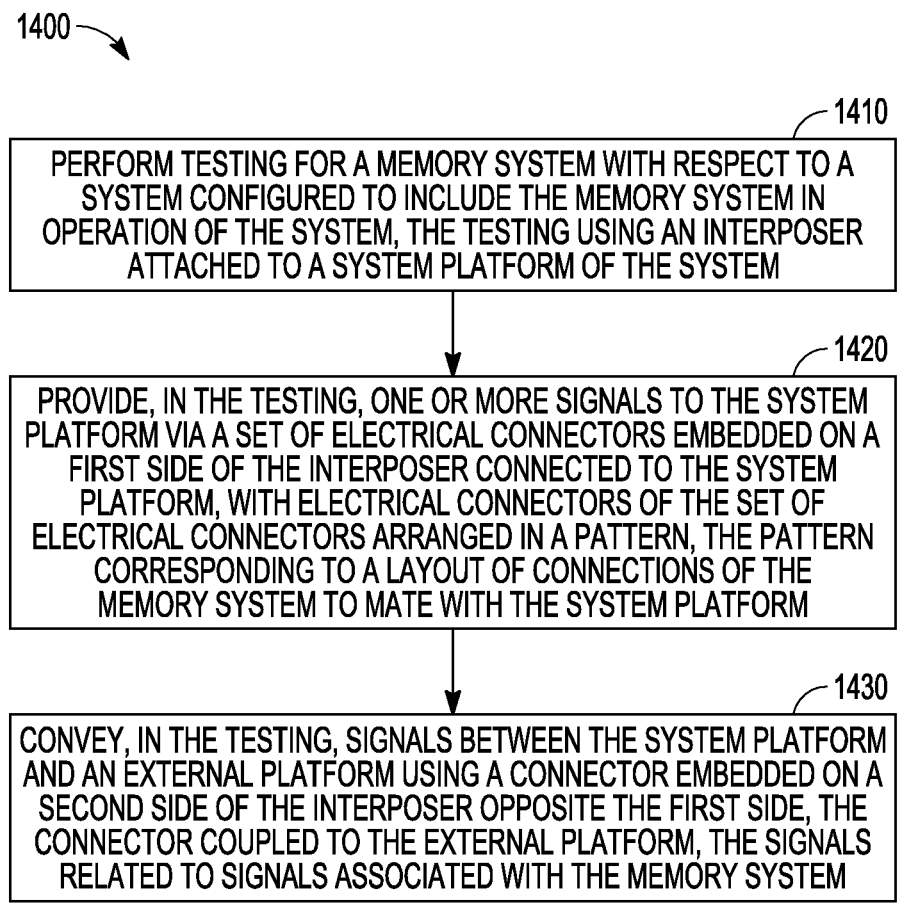
FIG. 14 is a flow diagram of features of an example method of performing testing of a system associated with a memory system, according to various embodiments.

FIG. 14 is a flow diagram of features of an embodiment of an example method 1400 of performing testing of a system associated with a memory system. At 1410, testing for a memory system is performed with respect to a system configured to include the memory system in operation of the system. The testing uses an interposer attached to a system platform of the system. At 1420, in the testing, one or more signals is provided to the system platform via a set of electrical connectors embedded on a first side of the interposer connected to the system platform. The electrical connectors of the set of electrical connectors are arranged in a pattern, the pattern corresponding to a layout of connections of the memory system to mate with the system platform. At 1430, in the testing, signals are conveyed between the system platform and an external platform using a connector embedded on a second side of the interposer opposite the first side, with the connector coupled to the external platform. The signals can be related to signals associated with the memory system.

Variations of method 1400 or methods similar to method 1400 can include a number of different embodiments that may be combined depending on the application of such methods and/or the architecture of systems in which such methods are implemented. Embodiments of method 1400 or methods similar to method 1400 can include measuring current consumption between the system platform and the memory system using a serial probe of the external platform with the external platform structured as a current probe platform with the memory system coupled to the current probe platform.

Variations of method 1400 or methods similar to method 1400 can include, with the memory system being a UFS memory system, probing UFS signals between the system platform and the UFS memory system coupled to the external platform. Such variations can include, with the memory system being a UFS memory system, testing the UFS memory system at different temperature conditions. Such variations can include emulating a UFS memory system with respect to the system platform with the external platform being a UFS emulator platform.

Testing associated with a memory system can include executing instructions, stored in a device, by a processing device that can cause performance of a number of operations. The processing device can be implemented as a set of one or more processing devices and the device storing the instructions can be implemented as one or more memory storage devices. The operations performed by executing such instructions by the processing device can include operations to perform the tasks of method 1400, methods similar to method 1400, or other techniques associated with testing as taught herein. The operations performed by executing instructions by the processing device can include operations to perform functions of systems as taught herein. Variations of instructions can include a number of different embodiments that may be combined depending on the application of testing associated with a memory system and/or the architecture of systems in which such testing is implemented.

The device storing such instructions can be implemented as a machine-readable storage device storing instructions, that when executed by one or more processors, cause a machine to perform operations to: perform testing for a memory system with respect to a system configured to include the memory system in operation of the system, the testing using an interposer attached to a system platform of the system; provide, in the testing, one or more signals to the system platform via a set of electrical connectors embedded on a first side of the interposer connected to the system platform, with electrical connectors of the set of electrical connectors arranged in a pattern, the pattern corresponding to a layout of connections of the memory system to mate with the system platform; and convey, in the testing, signals between the system platform and an external platform using a connector embedded on a second side of the interposer opposite the first side, the connector coupled to the external platform, the signals related to signals associated with the memory system.

Variations of instructions can include instructions to measure current consumption between the system platform and the memory system by use of a serial probe of the external platform with the external platform structured as a current probe platform with the memory system coupled to the current probe platform. Variations of instructions can include instructions, with the memory system being a UFS memory system, to probe UFS signals between the system platform and the UFS memory system coupled to the external platform. Variations of instructions can include, with the memory system being UFS memory system, instructions to test the UFS memory system at different temperature conditions. Such instructions can include instructions to emulate a UFS memory system with respect to the system platform with the external platform being a UFS emulator platform.

In various embodiments, a system can include an interposer to attach to a system platform; a set of electrical connectors embedded on a first side of the interposer to connect to the system platform, with electrical connectors of the set of electrical connectors arranged in a pattern, the pattern corresponding to a layout of connections of a memory system to mate with the system platform; and a connector embedded on a second side of the interposer opposite the first side, the connector operable to couple to an external platform to convey signals between the system platform and the external platform, the signals related to signals associated with the memory system. The system connector can be embedded on the second side with electrical pins extending outward from the second side of the interposer.

Variations of such a system and its features, as taught herein, can include a number of different embodiments that may be combined depending on the application of such systems and/or the architecture in which systems are implemented. Variations of a system, as taught herein, can include the interposer arranged to include a set of test points on the second side of the interposer opposite the first side, to measure memory system signals by an external equipment. The interposer can be smaller than the memory system. The memory system can be a memory packaged with a ball grid array.

Variations of a system can include the external platform structured to include a current probe platform or a memory emulator platform. The connector can be arranged to couple to the current probe platform or to the memory emulator platform directly or by a cable. In various embodiments, the system platform can be a motherboard of a mobile phone. The memory system can be a managed memory system.

In various embodiments, a system can include a UFS interposer structured to attach to a system platform; a UFS platform coupled to the UFS interposer; a set of electrical connectors embedded on a first side of the UFS interposer to connect to the system platform, with electrical connectors of the set of electrical connectors arranged in a pattern, the pattern corresponding to a layout of connections of a UFS memory system to mate with the system platform; and a connector embedded on a second side of the UFS interposer opposite the first side, the connector to couple to the UFS platform to convey signals between the system platform and the UFS platform, the signals related to signals associated with the UFS memory system.

Variations of such a system and its features, as taught herein, can include a number of different embodiments that may be combined depending on the application of such systems and/or the architecture in which systems are implemented. Variations of a system, as taught herein, can include the UFS platform being a UFS current probe having a region to attach the UFS memory system. The connector can be arranged to couple to the UFS current probe platform directly or by a cable. The UFS current probe platform can include serial current probes. The UFS current probe can be operable with a temperature controller to subject the UFS memory system to testing over a range of temperatures. The range of temperatures can be a range equal to or within about −40° C. to about 125° C.

Variations of a system, as taught herein, can include the UFS platform being a UFS emulator platform. The connector can be arranged to couple to the UFS emulator platform directly or by a cable. The UFS emulator platform includes a processing device and a storage device.

The following are example embodiments of systems and methods, in accordance with the teachings herein.

An example system 1 can comprise: an interposer to attach to a system platform; a set of electrical connectors embedded on a first side of the interposer to connect to the system platform, with electrical connectors of the set of electrical connectors arranged in a pattern, the pattern corresponding to a layout of connections of a memory system to mate with the system platform; and a connector embedded on a second side of the interposer opposite the first side, the connector operable to couple to an external platform to convey signals between the system platform and the external platform, the signals related to signals associated with the memory system.

An example system 2 can include features of example system 1 and can include the connector embedded on the second side to include electrical pins extending outward from the second side of the interposer.

An example system 3 can include features of any of the preceding example systems and can include the interposer to include a set of test points on the second side of the interposer opposite the first side, to measure memory system signals by an external equipment.

An example system 4 can include features of any of the preceding example systems and can include the interposer being smaller than the memory system.

An example system 5 can include features of any of the preceding example systems and can include the memory system being a memory packaged with a ball grid array.

An example system 6 can include features of any of the preceding example systems and can include the external platform to include a current probe platform or a memory emulator platform.

An example system 7 can include features of any of the preceding example systems and can include the connector being arranged to couple to the current probe platform or to the memory emulator platform directly or by a cable.

An example system 8 can include features of any of the preceding example systems and can include the system platform being a motherboard of a mobile phone.

An example system 9 can include features of any of the preceding example systems and can include the memory system being a managed memory system.

An example system 10 can comprise: a universal flash storage (UFS) interposer structured to attach to a system platform; a UFS platform coupled to the UFS interposer; a set of electrical connectors embedded on a first side of the UFS interposer to connect to the system platform, with electrical connectors of the set of electrical connectors arranged in a pattern, the pattern corresponding to a layout of connections of a UFS memory system to mate with the system platform; and a connector embedded on a second side of the UFS interposer opposite the first side, the connector to couple to the UFS platform to convey signals between the system platform and the UFS platform, the signals related to signals associated with the UFS memory system.

An example system 11 can include features of example system 10 and can include the UFS platform being a UFS current probe having a region to attach the UFS memory system.

An example system 12 can include features of any of the preceding example systems 10 and 11 and can include the connector being arranged to couple to the UFS current probe platform directly or by a cable.

An example system 13 can include features of any of the preceding example systems 10-12 and can include the UFS current probe platform to include serial current probes.

An example system 14 can include features of any of the preceding example systems 10-13 and can include the UFS current probe being operable with a temperature controller to subject the UFS memory system to testing over a range of temperatures.

An example system 15 can include features of any of the preceding example systems 10-13 and can include the range of temperatures being a range equal to or within about −40° C. to about 125° C.

An example system 16 can include features of any of the preceding example systems 10-15 and can include the UFS platform being a UFS emulator platform.

An example system 17 can include features of any of the preceding example systems 10-16 and can include the connector being arranged to couple to the UFS emulator platform directly or by a cable.

An example system 18 can include features of any of the preceding example systems 10-17 and can include the UFS current probe platform to include a processing device and a storage device.

An example method 1 can comprise: performing testing for a memory system with respect to a system configured to include the memory system in operation of the system, the testing using an interposer attached to a system platform of the system; providing, in the testing, one or more signals to the system platform via a set of electrical connectors embedded on a first side of the interposer connected to the system platform, with electrical connectors of the set of electrical connectors arranged in a pattern, the pattern corresponding to a layout of connections of the memory system to mate with the system platform; and conveying, in the testing, signals between the system platform and an external platform using a connector embedded on a second side of the interposer opposite the first side, the connector coupled to the external platform, the signals related to signals associated with the memory system.

An example method 2 can include features of example method 1 and can include measuring current consumption between the system platform and the memory system using a serial probe of the external platform with the external platform structured as a current probe platform with the memory system coupled to the current probe platform.

An example method 3 can include features of any of the preceding example methods and can include, with the memory system being a universal flash storage (UFS) memory system, probing UFS signals between the system platform and the UFS memory system coupled to the external platform.

An example method 4 can include features of any of the preceding example methods and can include, with the memory system being a universal flash storage (UFS) memory system, testing the UFS memory system at different temperature conditions.

An example method 5 can include features of any of the preceding example methods and can include emulating a universal flash storage (UFS) memory system with respect to the system platform with the external platform being a UFS emulator platform.

An example machine-readable storage device 1 storing instructions, that when executed by one or more processors, cause a machine to perform operations to: perform testing for a memory system with respect to a system configured to include the memory system in operation of the system, the testing using an interposer attached to a system platform of the system; provide, in the testing, one or more signals to the system platform via a set of electrical connectors embedded on a first side of the interposer connected to the system platform, with electrical connectors of the set of electrical connectors arranged in a pattern, the pattern corresponding to a layout of connections of the memory system to mate with the system platform; and convey, in the testing, signals between the system platform and an external platform using a connector embedded on a second side of the interposer opposite the first side, the connector coupled to the external platform, the signals related to signals associated with the memory system.

An example machine-readable storage device 2 can include features of example machine-readable storage device 1 and can include instructions to measure current consumption between the system platform and the memory system using a serial probe of the external platform with the external platform structured as a current probe platform with the memory system coupled to the current probe platform.

An example machine-readable storage device 3 can include features of any of the preceding example machine-readable storage devices and can include, with the memory system being a universal flash storage (UFS) memory system, instructions to probe UFS signals between the system platform and the UFS memory system coupled to the external platform.

An example machine-readable storage device 4 can include features of any of the preceding example machine-readable storage devices and can include, with the memory system being a universal flash storage (UFS) memory system, instructions to test the UFS memory system at different temperature conditions An example machine-readable storage device 5 can include features of any of the preceding example machine-readable storage devices and can include instructions to emulate a universal flash storage (UFS) memory system with respect to the system platform with the external platform being a UFS emulator platform.

An example machine-readable storage device 6 can include features of any of the preceding example machine-readable storage devices, instructions to perform operations of any features of the example methods 1-5, instructions to perform functions associated with any features of example systems 1-9 and example systems 10-18.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
    an interposer to attach to a system platform;
    a set of electrical connectors embedded on a first side of the interposer to connect to the system platform, with electrical connectors of the set of electrical connectors arranged in a pattern, the pattern corresponding to a layout of connections of a memory system, the memory system structured to mate with the system platform without the interposer in non-testing operation of a system in which the system platform is disposed, with the system platform being separated from the memory system in testing of the system; and
    a connector embedded on a second side of the interposer opposite the first side, the connector operable to couple to an external platform to convey signals between the system platform and the external platform, the signals related to signals associated with the memory system, the external platform being a testing platform to test the system with respect to the memory system and being separate from the memory system and from the system platform in the non-testing operation of the system.

2. The apparatus of claim 1, wherein the connector embedded on the second side includes electrical pins extending outward from the second side of the interposer.

3. The apparatus of claim 1, wherein the interposer includes a set of test points on the second side of the interposer opposite the first side, to measure memory system signals by an external equipment.

4. The apparatus of claim 1, wherein the interposer is smaller than the memory system.

5. The apparatus of claim 1, wherein the memory system is a memory packaged with a ball grid array.

6. The apparatus of claim 1, wherein the external platform includes a current probe platform or a memory emulator platform.

7. The apparatus of claim 6, wherein the connector is arranged to couple to the current probe platform or to the memory emulator platform directly or by a cable.

8. The apparatus of claim 1, wherein the system platform is a motherboard of a mobile phone.

9. The apparatus of claim 1, wherein the memory system is a managed memory system.

10. A system comprising:
    a universal flash storage (UFS) interposer structured to attach to a system platform;
    a UFS platform coupled to the UFS interposer;
    a set of electrical connectors embedded on a first side of the UFS interposer to connect to the system platform, with electrical connectors of the set of electrical connectors arranged in a pattern, the pattern corresponding to a layout of connections of a UFS memory system, the UFS memory, system structured to mate with the system platform without the UFS interposer in non-testing operation of a UFS system in which the system platform is disposed, with the system platform being separated from the UFS memory system in testing of the UFS system; and
    a connector embedded on a second side of the UFS interposer opposite the first side, the connector to couple to the UFS platform to convey signals between the system platform and the UFS platform, the signals related to signals associated with the UFS memory system, the UFS platform being a testing platform to test the UFS system with respect to the UFS memory system and being separate from the UFS memory system and from the system platform in the non-testing operation of the UFS system.

11. The system of claim 10, wherein the UFS platform is a UFS current probe platform having a region to attach the UFS memory system.

12. The system of claim 11, wherein the connector is arranged to couple to the UFS current probe platform directly or by a cable.

13. The system of claim 11, wherein the UFS current probe platform includes serial current probes.

14. The system of claim 11, wherein the UFS current probe platform is operable with a temperature controller to subject the UFS memory system to testing over a range of temperatures.

15. The system of claim 14, wherein the range of temperatures is a range equal to or within about −40° C. to about 125° C.

16. The system of claim 10, wherein the UFS platform is a UFS emulator platform.

17. The system of claim 16, wherein the connector is arranged to couple to the UFS emulator platform directly or by a cable.

18. The system of claim 16, wherein the emulator platform includes a processing device and a storage device.

19. A method comprising:
    performing testing for a memory system with respect to a system configured to include the memory system in operation of the system, the testing using an interposer attached to a system platform of the system;
    providing, in the testing, one or more signals to the system platform via a set of electrical connectors embedded on a first side of the interposer connected to the system platform, with electrical connectors of the set of electrical connectors arranged in a pattern, the pattern corresponding to a layout of connections of the memory system structured to mate with the system platform without the interposer in non-testing operation of the system in which the system platform is disposed, with the system platform being separated from the memory system in testing of the system; and
    conveying, in the testing, signals between the system platform and an external platform using a connector embedded on a second side of the interposer opposite the first side, the connector coupled to the external platform, the signals related to signals associated with the memory system, the external platform being a testing platform to test the system with respect to the memory system and being separate from the memory system and from the system platform in the non-testing operation of the system.

20. The method of claim 19, wherein the method includes measuring current consumption between the system platform and the memory system using a serial probe of the external platform with the external platform structured as a current probe platform with the memory system coupled to the current probe platform.

21. The method of claim 19, wherein the method includes, with the memory system being a universal flash storage (UFS) memory system, probing UFS signals between the system platform and the UFS memory system coupled to the external platform.

22. The method of claim 19, wherein the method includes, with the memory system being a universal flash storage (UFS) memory system, testing the UFS memory system at different temperature conditions.

23. The method of claim 19, wherein the method includes emulating a universal flash storage (UFS) memory system with respect to the system platform with the external platform being a UFS emulator platform.

* * * * *